US010481231B2

United States Patent
Takeshima et al.

(10) Patent No.: US 10,481,231 B2
(45) Date of Patent: Nov. 19, 2019

(54) MAGNETIC RESONANCE IMAGING APPARATUS AND IMAGE GENERATION METHOD

(71) Applicant: Toshiba Medical Systems Corporation, Otawara-shi (JP)

(72) Inventors: Hidenori Takeshima, Minato (JP); Masao Yui, Otawara (JP); Takashi Shigeta, Nasushiobara (JP)

(73) Assignee: Canon Medical Systems Corporation, Otawara-shi (JP)

( * ) Notice: Subject to any disclaimer, the term of this patent is extended or adjusted under 35 U.S.C. 154(b) by 112 days.

(21) Appl. No.: 15/342,576

(22) Filed: Nov. 3, 2016

(65) Prior Publication Data
US 2017/0131373 A1 May 11, 2017

(30) Foreign Application Priority Data

Nov. 6, 2015 (JP) ................................ 2015-218826

(51) Int. Cl.
| G01R 33/48 | (2006.01) |
| G01R 33/56 | (2006.01) |
| G01R 33/561 | (2006.01) |
| G01R 33/50 | (2006.01) |

(52) U.S. Cl.
CPC ......... *G01R 33/4818* (2013.01); *G01R 33/50* (2013.01); *G01R 33/5608* (2013.01); *G01R 33/5611* (2013.01)

(58) Field of Classification Search
CPC ................ G01R 33/4818; G01R 33/50
See application file for complete search history.

(56) References Cited

U.S. PATENT DOCUMENTS

| 9,651,641 | B2* | 5/2017 | Praveen | G01R 33/54 |
| 2011/0006768 | A1* | 1/2011 | Ying | G01R 33/5611 |
| | | | | 324/309 |
| 2013/0300416 | A1* | 11/2013 | Welch | G01R 33/448 |
| | | | | 324/309 |
| 2015/0168522 | A1* | 6/2015 | Gulaka | G01R 33/4818 |
| | | | | 324/309 |

(Continued)

OTHER PUBLICATIONS

Jeffrey Tsao et al., "k-t BLAST and k-t SENSE: Dynamic MRI with High Frame Rate Exploiting Spatiotemporal Correlations," Magnetic Resonance in Medicine 50, 2003, 12 Pages.

(Continued)

*Primary Examiner* — Jermele M Hollington
*Assistant Examiner* — Feba Pothen
(74) *Attorney, Agent, or Firm* — Oblon, McClelland, Maier & Neustadt, L.L.P.

(57) ABSTRACT

A magnetic resonance imaging apparatus according to an embodiment includes first processing circuitry and second processing circuitry. The first processing circuitry executes a pulse sequence in a acquisition pattern set such that sampling densities of a plurality of pieces of k space data are made different in accordance with a predetermined imaging parameter when the pieces of k space data having different values of the imaging parameter are acquired while changing the values of the imaging parameter. The second processing circuitry generates an image based on the pieces of k space data.

11 Claims, 8 Drawing Sheets

(56) References Cited

U.S. PATENT DOCUMENTS

| | | | | |
|---|---|---|---|---|
| 2015/0346305 A1* | 12/2015 | King | ............ | G01R 33/5611 |
| | | | | 324/309 |
| 2015/0369893 A1* | 12/2015 | Takeshima | ......... | G01R 33/4818 |
| | | | | 324/309 |
| 2016/0054418 A1* | 2/2016 | Doneva | ............ | G01R 33/5611 |
| | | | | 324/309 |

OTHER PUBLICATIONS

Feng Huang et al., "k-t GRAPPA: A k-space Implementation for Dynamic MRI with High Reduction Factor," Magnetic Resonance in Medicine 54, 2005, 13 Pages.

Henrik Pedersen et al., "k-t PCA: Temporally Constrained k-t BLAST Reconstruction Using Principal Component Analysis," Magnetic Resonance in Medicine 62, 2009, 11 Pages.

Sajan Goud Lingala et al, "Accelerated Dynamic MRI Exploiting Sparsity and Low-Rank Structure: k-t SLR," IEEE Transactions on Medical Imaging, vol. 30, No. 5, May 2011, 13 Pages.

Altbach, Maria I., Ali Bilgin, Zhigiang Li, Eric W. Clarkson, Theodore P. Trouard, and Arthur F. Gmitro. "Processing of radial fast spin‐echo data for obtaining T2 estimates from a single k‐space data set." Magnetic resonance in medicine 54, No. 3 (2005): 549-559.†

* cited by examiner
† cited by third party

MAGNETIC RESONANCE IMAGING APPARATUS AND IMAGE GENERATION METHOD

CROSS-REFERENCE TO RELATED APPLICATIONS

This application is based upon and claims the benefit of priority from Japanese Patent Application No. 2015-218826, filed on Nov. 6, 2015; the entire contents of which are incorporated herein by reference.

FIELD

Embodiments described herein relate generally to a magnetic resonance imaging apparatus and an image generation method.

BACKGROUND

A magnetic resonance imaging apparatus (hereinafter, magnetic resonance imaging (MRI) apparatus) is an apparatus that visualizes atom distribution in a subject nondestructively using nature that atoms of hydrogen and the like arranged in a magnetic field selectively absorb and release only electromagnetic waves of a frequency determined depending on the types of the atoms and the magnetic field among electromagnetic waves of various frequencies.

The MRI apparatus controls radio frequency (RF) pulses and the magnetic field in accordance with control flow called a pulse sequence in data acquisition. Although depending on the type of the pulse sequence, the pulse sequence has imaging conditions such as a flip angle, repetition time (TR), echo time (TE), inversion time (TI), spin lock time (TSL), and saturation recovery time (TSR). There are techniques of generating a parameter mapping image, such as T1 mapping and T2 mapping, by generating a plurality of images having different contrasts while stepwisely changing some of the imaging conditions and estimating parameters depending on target tissues, such as a T1 value and a T2 value, using the difference in the contrast among the plurality of images.

DETAILED DESCRIPTION

A magnetic resonance imaging apparatus according to an embodiment includes first processing circuitry and second processing circuitry. The first processing circuitry executes a pulse sequence in a acquisition pattern set such that sampling densities of a plurality of pieces of k space data are made different in accordance with a predetermined imaging parameter when the pieces of k space data having different values of the imaging parameter are acquired while changing the values of the imaging parameter. The second processing circuitry generates an image based on the pieces of k space data.

Hereinafter, a magnetic resonance imaging apparatus and an image generation method according to an embodiment will be described in detail.

Embodiment

Figure 1:
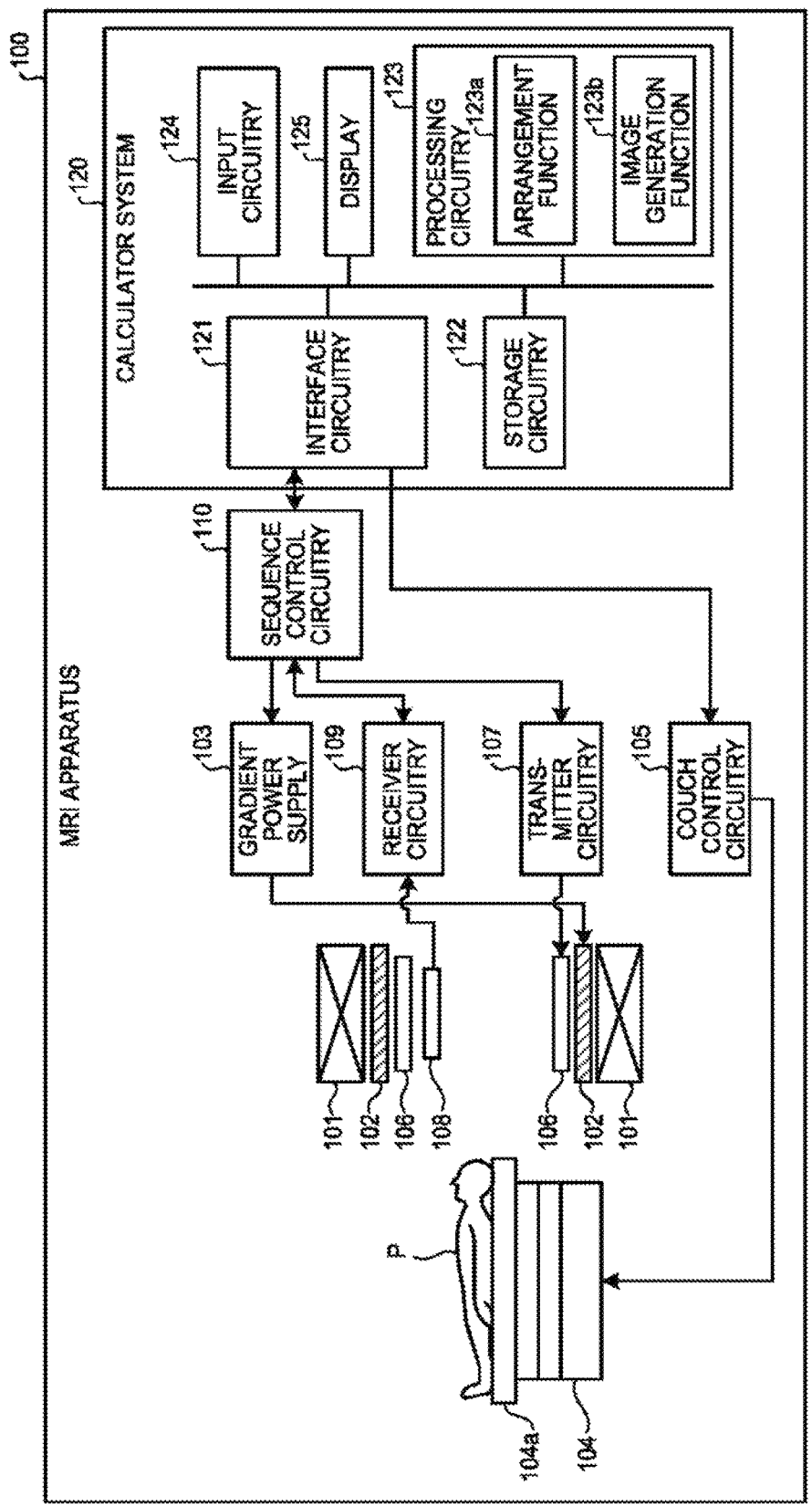
FIG. 1 is a block diagram illustrating an MRI apparatus according to a first embodiment.

FIG. 1 is a block diagram illustrating an MRI apparatus 100 according to a first embodiment. As illustrated in FIG. 1, the MRI apparatus 100 includes a static field magnet 101, a gradient coil 102, a gradient power supply 103, a couch 104, couch control circuitry 105, transmitter coil 106, transmitter circuitry 107, a receiver coil array 108, receiver circuitry 109, sequence control circuitry 110, and a calculator system 120. It should be noted that the MRI apparatus 100 does not include a subject P (for example, human body).

The static field magnet 101 is a magnet formed into a hollow cylindrical shape (including a shape having an elliptical cross section orthogonal to an axis of the cylinder) and generates a uniform magnetostatic field in an inner space thereof. The static field magnet 101 is, for example, a permanent magnet or a superconductive magnet.

The gradient coil 102 is a coil formed into a hollow cylindrical shape (including a shape having an elliptical cross section orthogonal to an axis of the cylinder) and is arranged at the inner side of the static field magnet 101. The gradient coil 102 is formed by combining three coils corresponding to respective axes of X, Y and Z orthogonal to one another and these three coils generate gradient magnetic fields having magnetic field intensities varying along the respective axes of X, Y and Z on reception of individual supply of electric currents from the gradient power supply 103. The gradient magnetic fields along the respective axes of X, Y and Z that the gradient coil 102 generates correspond to, for example, a slice-selective gradient magnetic field Gs, a phase-encoding gradient magnetic field Ge, and a readout gradient magnetic field Gr, respectively. The slice-selective gradient magnetic field Gs is used for desirably determining a cross section of imaging. The phase-encoding gradient magnetic field Ge is used for changing a phase of a magnetic resonance signal (MR signal) in accordance with a spatial position. The readout gradient magnetic field Gr is used for changing the frequency of the MR signal in accordance with the spatial position.

The gradient power supply 103 supplies current to the gradient coil 102. For example, the gradient power supply 103 supplies currents individually to the respective three coils forming the gradient coil 102.

The couch 104 includes a couchtop 104a on which the subject P is placed and inserts the couchtop 104a into a cavity (imaging port) of the gradient coil 102 in a state where the subject P has been placed under control by the couch control circuitry 105. Normally, the couch 104 is installed such that the lengthwise direction thereof is in parallel with a center axis of the static field magnet 101.

The couch control circuitry 105 is a processor that drives the couch 104 to move the couchtop 104a in the lengthwise direction and the up-down direction under control by the calculator system 120.

The transmitter coil 106 is arranged at the inner side of the gradient coil 102 and generates a high-frequency magnetic field on reception of supply of radio frequency (RF) pulses from the transmitter circuitry 107.

The transmitter circuitry 107 supplies the RF pulses corresponding to a Larmor frequency that is determined based on the type of target atoms and the magnetic field intensity to the transmitter coil 106.

The receiver coil array 108 is arranged at the inner side of the gradient coil 102 and receives magnetic resonance signals (hereinafter, referred to as MR signals) that are generated from the subject P owing to an influence of the high-frequency magnetic field. When the receiver coil array 108 receives the MR signals, it outputs the received MR signals to the receiver circuitry 109. In the first embodiment, the receiver coil array 108 is a coil array having equal to or more than one, typically, a plurality of receiver coils.

The receiver circuitry 109 generates pieces of MR data based on the MR signals that the receiver coil array 108 outputs. The receiver circuitry 109 generates the pieces of MR data by, for example, converting the MR signals that the receiver coil array 108 output into digital signals. Furthermore, the receiver circuitry 109 transmits the generated pieces of MR data to the sequence control circuitry 110.

It should be noted that a mount device including the static field magnet 101 and the gradient coil 102 may include the receiver circuitry 109. In the first embodiment, the MR signals that respective coil elements (respective receiver coils) of the receiver coil array 108 output are appropriately distributed and synthesized to be output to the receiver circuitry 109 based on a unit called channel or the like. The pieces of MR data are therefore handled for each channel in pieces of processing at subsequent stages by the receiver circuitry 109 and subsequent components. The total number of coil elements and the total number of channels are the same in some cases, the total number of channels is smaller than the total number of coil elements in other cases, and the total number of channels is larger than the total number of coil elements in still other cases. Hereinafter, when "each channel" is referred to, corresponding processing may be performed for each coil element or may be performed for each channel formed by distributing and synthesizing the coil elements. It should be noted that the distribution and synthesis timing is not limited to the above-mentioned timing. It is sufficient that the MR signals or the pieces of MR data are distributed and synthesized for each channel before reconstruction processing, which will be described later.

The sequence control circuitry 110 performs imaging of the subject P by driving the gradient power supply 103, the transmitter circuitry 107, and the receiver circuitry 109 based on sequence information that is transmitted from the calculator system 120. The sequence control circuitry 110 acquires the pieces of MR data by performing the imaging of the subject P. In other words, the sequence control circuitry 110 acquires the MR signals because the pieces of MR data that are acquired are generated based on the MR signals. For example, the sequence control circuitry 110 is implemented by a processor. The sequence information is information defining procedures for imaging. The sequence information defines the intensity and the supply timing of power that the gradient power supply 103 supplies to the gradient coil 102, the intensity and the application timing of the RF pulses that the transmitter circuitry 107 transmits to the transmitter coil 106, the detection timing of the MR signals by the receiver circuitry 109, and the like.

It should be noted that when the sequence control circuitry 110 receives the pieces of MR data from the receiver circuitry 109 as a result of the imaging of the subject P by driving the gradient power supply 103, the transmitter circuitry 107, and the receiver circuitry 109, it transfers the received pieces of MR data to the calculator system 120. The sequence control circuitry 110 is an example of the first processing circuitry.

The calculator system 120 performs control of the MRI apparatus 100 overall, data acquisition, image reconstruction, and the like. The calculator system 120 includes interface circuitry 121, storage circuitry 122, processing circuitry 123, input circuitry 124, and a display 125.

The interface circuitry 121 transmits the sequence information to the sequence control circuitry 110 and receives the pieces of MR data from the sequence control circuitry 110. When the interface circuitry 121 receives the pieces of MR data, it stores the pieces of received MR data in the storage circuitry 122. An arrangement function 123a, which will be described later, of the processing circuitry 123 arranges the pieces of MR data stored in the storage circuitry 122 in a k space. As a result, the storage circuitry 122 stores therein the pieces of k space data for a plurality of channels. In this manner, the pieces of k space data are arranged. The interface circuitry 121 is implemented by, for example, a network interface card.

The storage circuitry 122 stores therein the pieces of MR data received by the interface circuitry 121, the pieces of k space data arranged in the k space by the arrangement function 123a, which will be described later, image data generated by an image generation function 123b, which will be described later, and the like. Furthermore, the storage circuitry 122 stores therein various types of computer programs. The storage circuitry 122 is implemented by, for example, a random access memory (RAM), a semiconductor memory element such as a flash memory, a hard disk, or an optical disc.

The input circuitry 124 receives various types of instructions and input of information from an operator such as a physician and a medical radiology technician. The input circuitry 124 is implemented by, for example, a trackball, a switch button, a mouse, and a keyboard. The input circuitry 124 is connected to the processing circuitry 123, converts an input operation received from the operator into an electric signal, and outputs it to the processing circuitry 123.

The display 125 displays various types of graphical user interfaces (GUIs), various types of images generated by the image generation function 123b, which will be described later, and the like under control by the processing circuitry 123.

The processing circuitry 123 controls the MRI apparatus 100 overall. To be specific, the processing circuitry 123 generates the sequence information based on imaging conditions (imaging parameters) that the operator inputs through the input circuitry 124 and transmits the generated sequence information to the sequence control circuitry 110 to control the imaging. Furthermore, the processing circuitry 123 controls generation (reconstruction) of an image based on the pieces of MR data that the sequence control circuitry 110 transmits as a result of the imaging and controls display by the display 125. The processing circuitry 123 is implemented by a processor. The processing circuitry 123 includes the arrangement function 123a and the image generation function 123b.

The respective processing functions of the arrangement function 123a and the image generation function 123b as the components of the processing circuitry 123 are stored in, for example, the storage circuitry 122 in forms of computer-executable programs. The processing circuitry 123 reads out the respective computer programs from the storage circuitry 122 and executes the respective read computer programs to implement the functions corresponding to the computer programs. In other words, the processing circuitry 123 that has read out the respective computer programs has the respective functions indicated in the processing circuitry 123 in FIG. 1. Although the single processing circuitry 123 implements the respective processing functions of the arrangement function 123a and the image generation function 123b in FIG. 1, the respective processing functions may be implemented by combining a plurality of independent processors to configure the processing circuitry 123 and executing, by the respective processors, the respective computer programs. The arrangement function 123a and the image generation function 123b will be described later.

The word "processor" referred in the above description indicates, for example, a central processing unit (CPU), a graphics processing unit (GPU), or circuitry such as an application specific integrated circuit (ASIC) and a programmable logic device (for example, a simple programmable logic device (SPLD), a complex programmable logic device (CPLD), and a field programmable gate array (FPGA)). It should be noted that the computer programs may be directly incorporated in circuitry of the processor instead of storage of the computer programs in the storage circuitry 122. In this case, the processor reads out and executes the computer programs incorporated in the circuitry to implement the functions.

The pulse sequence has, for example, the imaging parameters such as a flip angle, repetition time (TR), echo time (TE), inversion time (TI), spin lock time (TSL), and saturation recovery time (TSR) as described above. The contrast of an image that is provided by the MRI apparatus varies by changing values of any of these imaging parameters. The contrast varies based on a T1 value and a T2 value depending on target tissues as imaging targets. The operator can therefore know the imaging targets specifically using the difference in the contrast based on the plurality of imaging parameters. In consideration thereof, there are techniques of generating parameter mapping images such as T1 mapping and T2 mapping by generating a plurality of images having different contrasts while stepwisely changing values of some of the imaging parameters, estimating parameters depending on the target tissues, such as the T1 value and the T2 value, using the difference in the contrast among the plurality of images, and the estimated imaging parameters.

A T1 mapping image can be provided by using a method such as a Look-Locker method, a modified look-locker inversion recovery (MOLLI) method involving electrocardiographic synchronization, and a saturation-recovery single-shot acquisition (SASHA) method. A T2 mapping image can be provided by using a plurality of images having different TE values that have been imaged by the multi spin echo method. Images similar to time-series images are provided by aligning a plurality of images obtained while stepwisely changing the values of the imaging parameter. The MRI apparatus generates the parameter mapping images such as the T1 mapping and the T2 mapping by estimating coefficients of curves depending on the imaging parameters under an assumption that respective pixels follow the curves, estimating the T1 value and the T2 value based on the provided coefficients, and imaging the estimated T1 value and T2 value.

In a field involving time-series imaging such as cardiac cine imaging using the MRI apparatus, a method of shortening imaging time by performing data acquisition while skipping some phase encode lines in k space as an imaging space has been known. For example, as a method of performing data acquisition while skipping some phase encode lines in k space, parallel imaging method and compressed sensing method are known.

As described above, the MRI apparatus estimates the parameters such as the T1 value and the T2 value when generating the parameter mapping images. The MRI apparatus generates a plurality of images having different contrasts while stepwisely changing the values of some of the imaging parameters when estimating the parameters. It takes much time to estimate the parameters because the MRI apparatus generates the plurality of images as described above and it is difficult to estimate the parameters efficiently. Furthermore, as a result, the imaging time becomes long and it is difficult for the MRI apparatus to generate the parameter mapping images efficiently.

In order to solve the problems, the MRI apparatus 100 in the embodiment executes pieces of processing of various types in order to estimate the parameters efficiently as will be described below.

The arrangement function 123a arranges, in the k space, the pieces of MR data acquired by the sequence control circuitry 110 as the pieces of k space data for respective points on a p axis, which will be described later. In other words, the arrangement function 123a arranges, in the k space, the MR signals as the pieces of k space data for the respective points on the p axis, which will be described later, because the pieces of MR data are generated based on the MR signals as described above.

The image generation function 123b generates an image based on the pieces of k space data arranged by the arrangement function 123a. For example, the image generation function 123b generates a plurality of images having different contrasts while stepwisely changing the values of some of the above-mentioned imaging parameters. The image referred herein is a raw image that is used when parameter mapping, which will be described later, is generated. The image generation function 123b then estimates the parameters depending on the target tissues, such as the T1 value and the T2 value, using the difference in the contrast among the plurality of generated images. The image generation function 123b generates the parameter mapping image such as the T1 mapping and the T2 mapping by imaging the estimated parameters. That is to say, the image generation function 123b generates the mapping images for the imaging parameters.

The various types of parameter mapping images that the image generation function 123b generates will be described. Although four examples of the parameter mapping images will be described hereinafter, the parameter mapping images that the image generation function 123b generates are not limited to the following examples.

T1 Mapping Image

First, the T1 mapping image will be described. In a state where no RF pulse is applied to the subject P, a direction of a magnetization vector in an imaging target region (target region) of the subject P is the Z direction as the direction of a magnetostatic field. The intensity of the magnetization vector is assumed to be M0. When the subject P receives the RF pulses corresponding to the Larmor frequency, the intensity of the magnetization vector in the Z direction (longitudinal direction) in the target region of the subject P is lower than M0, and then gradually recovers to M0. When the time immediately after the reception of the RF pulses is expressed by t=0 and the intensity of the magnetization vector in the Z direction at t=0 is expressed by M1, the intensity M(t) of the magnetization vector in the Z direction can be expressed by the following equation (1).

$$M(t)=M0+(M1-M0)\exp(-t/T1) \quad (1)$$

A recovery process expressed by the equation (1), which is called T1 relaxation, can be indirectly imaged as variation in the contrast among images by performing imaging while stepwisely changing the values of a predetermined imaging parameter, for example, TI to generate the respective images obtained at the respective TI values. The method in which imaging is performed while changing the TI is known as the Look-Locker method. The MOLLI method or the SASHA method is employed for a site with a violent motion, such as the heart. The Look-Locker method and the MOLLI method are imaging methods in which M1=−M0 is set by irradiating the subject P with the RF pulses of 180 degrees or the RF pulses of larger than 90 degrees and close to 180 degrees. The SASHA method is an imaging method in which M1=0 is set. The T1 mapping is a technique in which the T1 values of the respective pixels are estimated while stepwisely changing the values of any of the above-mentioned imaging parameters and reflecting the estimated T1 values onto an image. The image generation function 123b generates the T1 mapping image based on the pieces of k space data using the above-mentioned technique. It should be noted that the MOLLI method is described in a literature of "D. R. Messroghli et al. "Modified Look-Locker Inversion Recovery (MOLLI) for High-Resolution T1 Mapping of the Heart," Magnetic Resonance in Medicine 52: 141-146 (2004)." and the like.

T2 Mapping Image

Next, the T2 mapping image will be described. Immediately after the subject P receives the RF pulses corresponding to the Larmor frequency, disturbance in components of the magnetization vector on the XY plane is the least. Thereafter, the components of the magnetization vector on the XY plane are gradually attenuated. A time constant of the attenuation that is not influenced by inhomogeneity of the magnetic field is referred to as the T2 value and a time constant of the attenuation that adds influence by the inhomogeneity of the magnetic field is referred to as a T2* value. These time constants of the attenuation can be reflected onto an image by imaging a plurality of images corresponding to a plurality of echo time values (TE values) and using the difference among the plurality of obtained images. To be specific, for example, in the T2 mapping, the T2 mapping image is generated by estimating the T2 values for the plurality of TE values using attenuation of the intensity M(t) of the magnetization vector on the XY plane relative to the intensity M0 of the magnetization vector at the initial time as indicated by the following equation (2) and reflecting the estimated T2 values onto the image.

$$M(t)=M0\exp(-TE/T2) \quad (2)$$

Furthermore, in T2* mapping, a T2* mapping image is generated by estimating the T2* values for the plurality of TE values and reflecting the estimated T2* values onto the image in the same manner as the T2 mapping. The image generation function 123b generates the T2 mapping image and the T2* mapping image based on the pieces of k space data using the above-mentioned techniques of the T2 mapping and the T2* mapping. It should be noted that the T2 value can be estimated by repeatedly performing imaging while removing the influence by the inhomogeneity of the magnetic field by a multiecho spin echo sequence. The T2* value can be estimated using a multiecho gradient echo sequence.

T1 ρ Mapping Image

Next, a T1 ρ mapping image will be described. When the magnetic field intensity of the MRI apparatus is considered to be, for example, approximately 1 to 7T, T1 relaxation corresponds to motion of molecules that occurs at the Larmor frequency of several tens to several hundred MHz. Meanwhile, motion of the molecules that occurs at a low frequency of several kHz includes motion based on molecular structures and compositions, such as magnetization transfer and chemical exchange. There is a T1ρ pulse sequence as a method of measuring relaxation at such a low frequency. With the T1ρ pulse sequence, exclusive pre-pulses are applied to the intensity M0 of the magnetization vector in the Z direction to attenuate the magnetization vector with the intensity depending on T1ρ, and then imaging is performed by a desired pulse sequence. The exclusive pre-pulses are applied such that after the magnetization vector in the Z direction is made to fall in the XY direction, spin lock pulses as pulses corresponding to a different low frequency from the Larmor frequency are continuously applied for TSL, and then the magnetization vector is returned to the Z direction. With the pre-pulses, the intensity S of a acquired signal is expressed by the following equation (3) when the signal intensity with no TSL is assumed to S0 and the intensity of the spin lock pulses is not changed.

$$S(TSL)=S0\exp(-TSL/T1\rho) \quad (3)$$

The T1ρ mapping is a technique in which T1ρ values of the respective pixels are estimated while stepwisely changing the TSL and the estimated T1ρ values are reflected onto an image. The image generation function 123b generates the T1ρ mapping image based on the pieces of k space data using this technique.

ADC Image

By applying gradient magnetic field for diffusion weighting prior to a desired pulse sequence to generate signal attenuation dependent on the diffusion and performing acquisition by the desired sequence, diffusion of molecules is reflected onto the image. A value indicating the degree of influence of the gradient magnetic field for diffusion weighting on the diffusion is referred to as the b value. When the signal intensity when the pre-pulses are not applied is expressed by S0, the signal intensity when the pre-pulses are applied is expressed by S(b), and a diffusion coefficient of the molecules is expressed by ADC, the following equation (4) is ideally satisfied.

$$S(b)=S0\exp(-b \cdot ADC) \quad (4)$$

S(b) attenuates as the b value is larger in many cases even if it is not ideal. One object of the diffusion is to generate an ADC image by estimating ADC values of the respective pixels while stepwisely changing the b value and reflecting the estimated ADC values onto an image. There are also techniques called diffusional kurtosis imaging (DKI) and Q-space imaging (QSI) with which diffusion is analyzed using more complicated models in consideration of the non-ideal portion. With these techniques, imaging is also performed while changing the b value whereas the types of the b value are increased in order to estimate the complex models in many cases. In the embodiment, the diffusion is considered to be one example of the parameter mapping. The image generation function 123b generates the ADC image based on the pieces of k space data using the technique.

Parameter Mapping and Sampling

As described above, the parameter mapping technique is considered as a technique in which a remarkable imaging parameter is stepwisely changed, any parameter is estimated from the degree of the signal attenuation, and the estimated parameter is reflected onto an image. In the following description, the imaging parameter that is stepwisely changed among the imaging parameters is referred to as the remarkable imaging parameter. Furthermore, an axis of the remarkable imaging parameter is referred to as the p axis. Although the following describes an example when the p axis is one-dimensional axis unless otherwise specified, the p axis may be equal to or higher than two-dimensional axis. In this case, it is sufficient that the following method is applied to each dimension as it is.

The parameter mapping technique requires a plurality of images for a plurality of points on the p axis to be generated when the parameter such as the T1 value, the T2 value, the T2* value, the T1ρ value, and the ADC value is estimated. When the p axis is, for example, the axis of the TI, a plurality of images for a plurality of TI values are required to be generated. The imaging time taken to generate the plurality of images is longer than that taken to generate one image in many cases. Accordingly, it is an important object for the MRI apparatus 100 to estimate the parameter efficiently. Efficient estimation of the parameter contributes to decrease in the imaging time.

Figure 2:
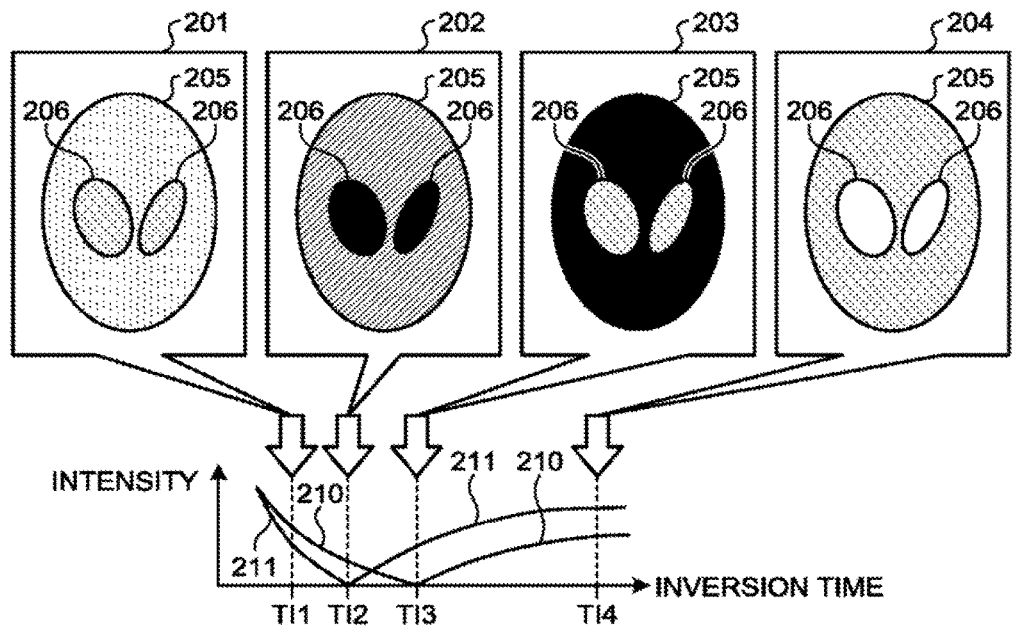
FIG. 2 is a diagram illustrating an example of curves of T1 recovery by a Look-Locker method.
Figure 3:
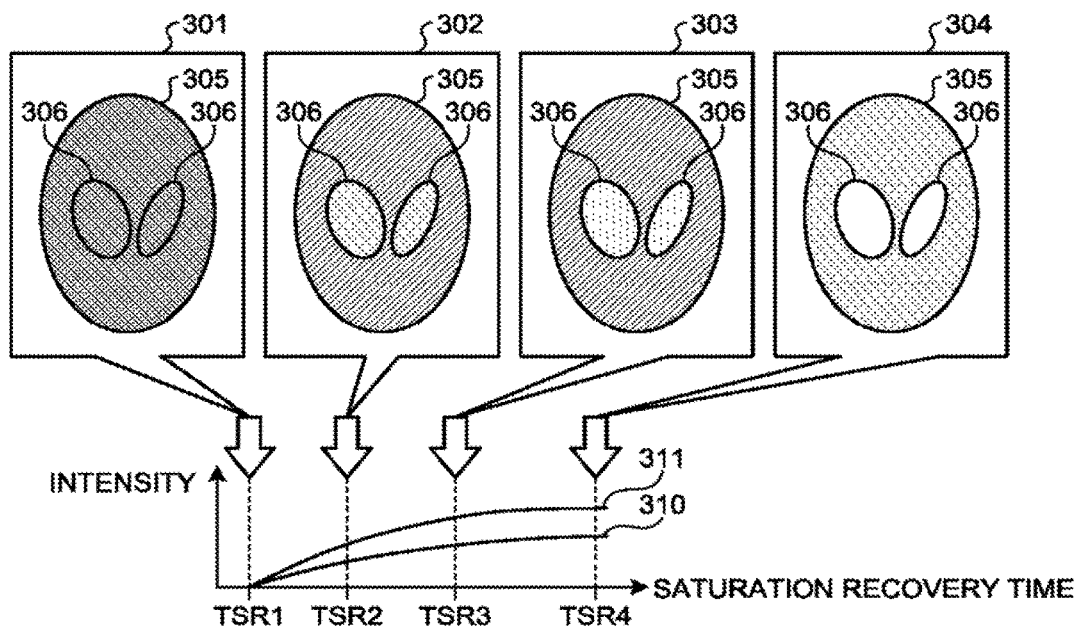
FIG. 3 is a diagram illustrating an example of curves of the T1 recovery by a SASHA method.
Figure 4:
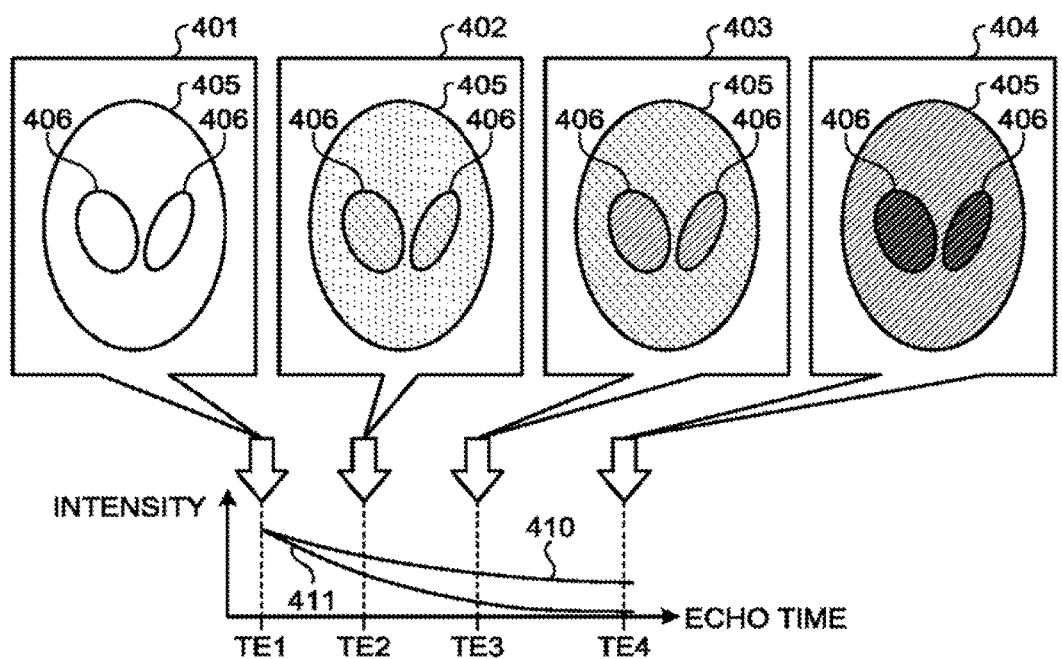
FIG. 4 is a diagram illustrating an example of curves of T2 attenuation at the time of multiecho spin echo imaging.

A curve indicating a relation between the signal intensity and a value of the remarkable imaging parameter on each pixel of an image as a target of the parameter mapping is provided as an exponential curve or a curve similar thereto when the value of the remarkable imaging parameter is stepwisely changed. Description is made using a specific example. FIG. 2 is a diagram illustrating an example of curves of the T1 recovery by the Look-Locker method. FIG. 3 is a diagram illustrating an example of curves of the T1 recovery by the SASHA method. FIG. 4 is a diagram illustrating an example of curves of T2 attenuation at the time of multiecho spin echo imaging.

A curve 210 illustrated in the example of FIG. 2 indicates a relation between the signal intensity and the TI value on each pixel in a region 205 in images 201 to 204. The signal intensity is expressed by an absolute value. In the example of FIG. 2, the curve of the T1 recovery recovered from −1 to 1 is therefore indicated as the curve 210 folded back at a null point, which will be described later. The curve 210 indicates a signal intensity corresponding to a TI value "TI1", a signal intensity corresponding to a TI value "TI2", a signal intensity corresponding to a TI value "TI3", and a signal intensity corresponding to a TI value "TI4" on each pixel in the region 205.

A curve 211 indicates a relation between the signal intensity and the TI value on each pixel in regions 206 in the images 201 to 204. The curve 211 indicates, for example, a signal intensity corresponding to the TI value "TI1", a signal intensity corresponding to the TI value "TI2", a signal intensity corresponding to the TI value "TI3", and a signal intensity corresponding to the TI value "TI4", on each pixel in the regions 206.

The region 205 and the regions 206 correspond to different tissues of the subject P. The T1 value is specific to each tissue when the magnetic field intensity is constant. The curves 210 and 211 indicating the relations between the signal intensity and the TI value are therefore specific to the respective tissues as illustrated in the example of FIG. 2.

A curve 310 illustrated in the example of FIG. 3 indicates a relation between the signal intensity and the TSR value on each pixel in a region 305 in images 301 to 304. For example, the curve 310 indicates a signal intensity corresponding to a TSR value "TSR1", a signal intensity corresponding to a TSR value "TSR2", a signal intensity corresponding to a TSR value "TSR3", and a signal intensity corresponding to a TSR value "TSR4", on each pixel in the region 305.

A curve 311 indicates a relation between the signal intensity and the TSR value on each pixel in regions 306 in the images 301 to 304. The curve 311 indicates, for example, a signal intensity corresponding to the TSR value "TSR1", a signal intensity corresponding to the TSR value "TSR2", a signal intensity corresponding to the TSR value "TSR3", and a signal intensity corresponding to the TSR value "TSR4", on each pixel in the regions 306.

The region 305 and the regions 306 correspond to different tissues of the subject P. As described above, the T1 value is specific to each tissue when the magnetic field intensity is constant. The curves 310 and 311 indicating the relations between the signal intensity and the TSR value are therefore specific to the respective tissues as illustrated in the example of FIG. 3.

A curve 410 illustrated in the example of FIG. 4 indicates a relation between the signal intensity and the TE value on each pixel in a region 405 in images 401 to 404. The curve 410 indicates, for example, a signal intensity corresponding to a TE value "TE1", a signal intensity corresponding to a TE value "TE2", a signal intensity corresponding to a TE value "TE3", and a signal intensity corresponding to a TE value "TE4", on each pixel in the region 405.

A curve 411 indicates a relation between the signal intensity and the TE value on each pixel in regions 406 in the images 401 to 404. The curve 411 indicates, for example, a signal intensity corresponding to the TE value "TE1", a signal intensity corresponding to the TE value "TE2", a signal intensity corresponding to the TE value "TE3", and a signal intensity corresponding to the TE value "TE4", on each pixel in the regions 406.

The region 405 and the regions 406 correspond to different tissues of the subject P. The T2 value is specific to each tissue. The curves 410 and 411 indicating the relations between the signal intensity and the TE value are therefore specific to the respective tissues as illustrated in the example of FIG. 4.

The amount of acquisition data is required to be ensured in order to provide sufficient estimation accuracy for the parameter as an estimation target. In this case, when the sufficient estimation accuracy of the parameter as the estimation target can be provided even with the small amount of acquisition data, the parameter can be estimated efficiently for a short period of time and eventually, the imaging time can be decreased. It should be noted that in the parameter mapping, an interval of imaging positions on the p axis and the number of phase encodes are restricted in some cases depending on the pulse sequence for acquisition in the parameter mapping. For example, in the Look-Locker method and multi echo acquisition, data acquisition for the same number of phase encodes is repeated at a fixed parameter interval on the p axis. With this acquisition manner, the acquisition positions on the p axis and the number of phase encodes cannot be freely controlled.

In the embodiment, when the acquirable positions on the p axis, the imaging matrix size, and the acquirable number of phase encodes are given, an arrangement manner of the phase encodes is controlled in order to provide the parameter (for example, T1, T2, T2*, T1ρ, or ADC) corresponding to the axes thereof for each pixel with high accuracy.

To be specific, the sequence control circuitry 110 in the embodiment biases the phase encodes for acquisition targets to the vicinity of the center in the k space in a region with violent variation in the pixel value on the p axis. The sequence control circuitry 110 acquires the pieces of data in a peripheral portion in the k space relatively largely without largely biasing the phase encodes for the acquisition targets to the vicinity of the center in the k space in a region with moderate variation in the pixel value on the p axis. The region with the violent variation in the pixel value indicates, for example, a region in which the degree of the variation in the pixel value is equal to or higher than a predetermined value and indicates a region in which an absolute value of the inclination of a tangent line is equal to or higher than the predetermined value on each of the above-mentioned various curves in FIGS. 2 to 4. The region with the moderate variation in the pixel value indicates, for example, a region in which the degree of the variation in the pixel value is lower than the predetermined value and indicates a region in which the absolute value of the inclination of the tangent line is lower than the predetermined value on each of the various curves.

A point (null point) at which the p axis and the curves are in contact with or intersect with each other contains important information when the parameter such as the T1 value is estimated. The sequence control circuitry 110 may therefore bias the phase encodes for the acquisition targets to the vicinity of the center in the k space in a region that includes the null point. The sequence control circuitry 110 may acquire the pieces of data in a peripheral portion in the k space relatively largely without largely biasing the phase encodes to the vicinity of the center in the k space in the region that does not include the null point.

That is to say, the sequence control circuitry 110 may bias the phase encodes for the acquisition targets to the vicinity of the center in the k space in at least one region of the region with the violent variation in the pixel value on the p axis and the region that includes the null point. Furthermore, the sequence control circuitry 110 may acquire the pieces of data in the peripheral portion in the k space relatively largely without largely biasing the phase encodes for the acquisition targets to the vicinity of the center in the k space in at least one region of the region with the moderate variation in the pixel value on the p axis and the region that does not include the null point.

An example of a method of controlling the arrangement manner of the phase encodings will be described with reference to FIG. 5 and FIG. 6.

Figure 5:
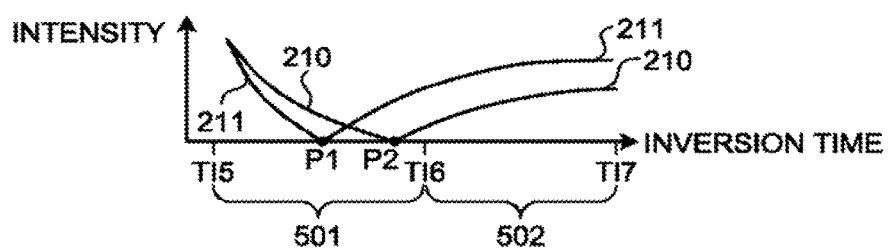
FIG. 5 is a diagram illustrating an example of T1 mapping.

FIG. 5 is a diagram illustrating an example of the T1 mapping. In the example of FIG. 5, in a range 501, the TI value is equal to or higher than "TI5" and lower than "TI6". The range 501 corresponds to a region with violent variation in the pixel value on a TI axis and a region that includes two null points P1 and P2.

In a range 502, the TI value is equal to or higher than "TI6" and lower than "TI7". The range 502 corresponds to a region with moderate variation in the pixel value on the TI axis and a region that does not include the two null points P1 and P2.

The sequence control circuitry 110 biases the phase encodes for the acquisition targets to the vicinity of the center in the k space in the range 501. The sequence control circuitry 110 acquires the pieces of data in the peripheral portion in the k space relatively largely without largely biasing the phase encodes for the acquisition targets to the vicinity of the center in the k space in the range 502.

Figure 6:
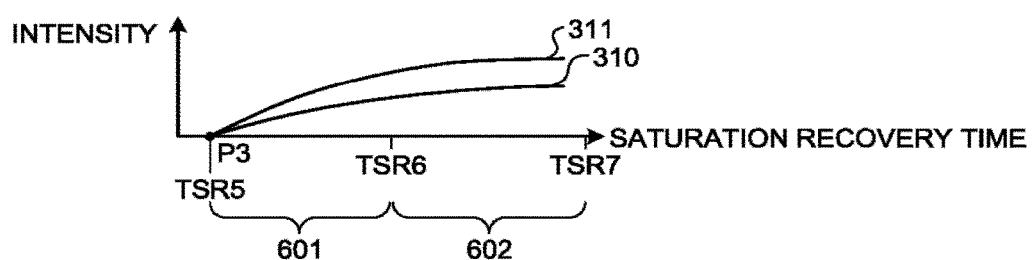
FIG. 6 is a diagram illustrating an example of T2 mapping.

FIG. 6 is a diagram illustrating an example of the T2 mapping. In the example of FIG. 6, in a range 601, the TSR value is equal to or higher than "TSR5" and lower than "TSR6". The range 601 corresponds to a region with violent variation in the pixel value on a TSR axis and a region that includes a null point P3.

In a range 602, the TSR value is equal to or higher than "TSR6" and lower than "TSR7". The range 602 corresponds to a region with moderate variation in the pixel value on the TSR axis and a region that does not include the null point P3.

The sequence control circuitry 110 biases the phase encodes for the acquisition targets to the vicinity of the center in the k space in the range 601. The sequence control circuitry 110 acquires the pieces of data in the peripheral portion in the k space relatively largely without largely biasing the phase encodes for the acquisition targets to the vicinity of the center in the k space in the range 602.

An example of a method of determining the region in which the phase encodes for the acquisition targets are biased to the vicinity of the center in the k space and the region in which the pieces of data in the peripheral portion in the k space are acquired relatively largely without largely biasing the phase encodes for the acquisition targets to the vicinity of the center in the k space will be described. For example, a database of the regions with the violent variations in the pixel value and the regions that include the null points on the acquisition images for the respective magnetostatic field intensities of the MRI apparatus and the respective sites of the subject P is previously formed based on previous learning and the like. The sequence control circuitry 110 acquires the region with the violent variation in the pixel value and the region that includes the null point for the site as the imaging target of the subject P from the database. The sequence control circuitry 110 handles the acquired regions as the regions in which the phase encodes for the acquisition targets are biased to the vicinity of the center in the k space. On the other hand, the sequence control circuitry 110 handles regions other than the acquired regions as the regions in which the pieces of data in the peripheral portion in the k space are acquired relatively largely without largely biasing the phase encodes for the acquisition targets to the vicinity of the center in the k space.

The region with the violent variation in the pixel value and the region with the moderate variation in the pixel value may be provided based on a separately defined reference in such a manner that a region at the front side relative to the center of point rows to be acquired on the p axis is set to the region with the violent variation in the pixel value and a region at the back side relative to the center of the point rows to be acquired on the p axis is set to the region with the moderate variation in the pixel value.

A relation between the magnetostatic field intensity of each MRI apparatus and the issue of the subject and the T1 value is already known. The T1 values corresponding to the respective tissues forming the imaging site and the magnetostatic field intensity of the MRI apparatus 100 are calculated. The maximum T1 value among the T1 values calculated for the respective issues may be applied to the above-mentioned equation (1) to specify a null point from the equation (1) and a region that includes the specified null point may be registered in the above-mentioned database. Furthermore, a value obtained by multiplying the maximum T1 value by a predetermined value (for example, 1.4, 0.6, or the like) may be used for partitioning the region in which the phase encodes for the acquisition targets are biased to the vicinity of the center in the k space and the region in which the pieces of data in the peripheral portion in the k space are acquired relatively largely without largely biasing the phase encodes for the acquisition targets to the vicinity of the center in the k space.

Alternatively, the operator may be capable of changing the region in which the phase encodes for the acquisition targets are biased to the vicinity of the center in the k space and the region in which the pieces of data in the peripheral portion in the k space are acquired relatively largely without largely biasing the phase encodes for the acquisition targets to the vicinity of the center in the k space.

Processing Flow

Figure 7:
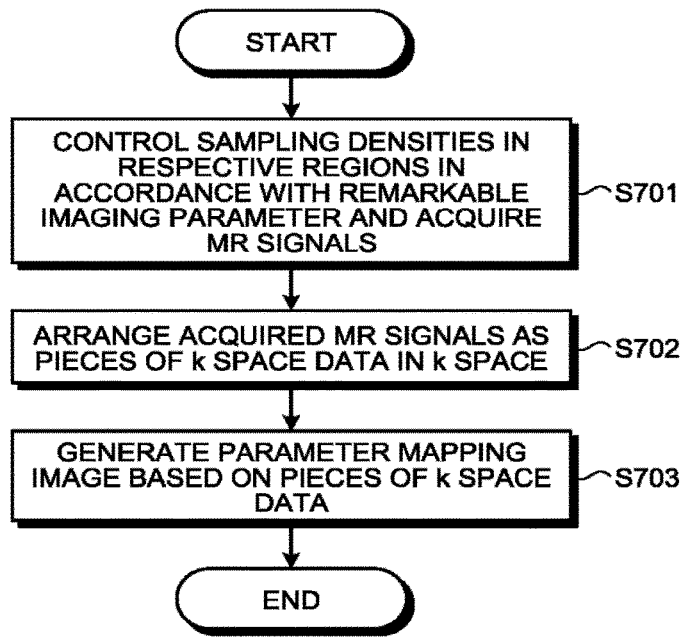
FIG. 7 is a flowchart illustrating an example of flow of processing of performing acquisition for parameter mapping in the embodiment.

An example of flow of processing of performing acquisition for the above-mentioned parameter mapping will be described with reference to FIG. 7. FIG. 7 is a flowchart illustrating an example of the flow of the processing of performing acquisition for the parameter mapping in the embodiment.

The sequence control circuitry 110 controls sampling densities in the above-mentioned respective regions in accordance with the remarkable imaging parameter and acquires the MR signals (step S701). The sampling densities that the sequence control circuitry 110 controls are based on the pulse sequence transmitted to the sequence control circuitry 110. The receiver coil array 108 acquires the MR signals.

An example of the control of the sampling densities (sampling density control) that is executed at step S701 will be described with reference to FIG. 8.

Sampling Density Control

Figure 8:
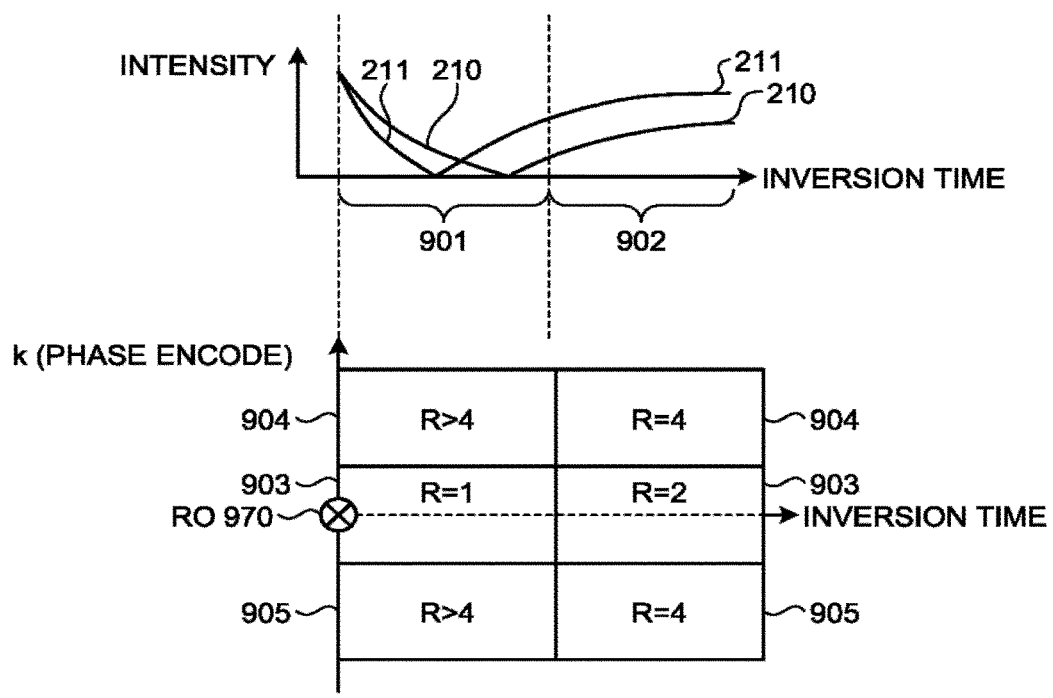
FIG. 8 is a diagram illustrating an example of sampling density control in the embodiment.

FIG. 8 is a diagram illustrating an example of the sampling density control in the embodiment. FIG. 8 illustrates an example of a method of controlling the sampling density for the TI in the T1 mapping based on the Look-Locker method. In the example of FIG. 8, a ratio "Reduction Factor" of the number of samples relative to full-sampling of the pieces of under-sampled k space data is expressed by "R". Also in the following description, the "Reduction Factor" is expressed by "R". In the example of FIG. 8, an axis of readout (RO) 970 is indicated in addition to an axis of the phase encode (Phase Encode). The axis of the readout 970 is orthogonal to the axis of the phase encode.

In the imaging by the Look-Locker method, variation in the signal intensity of an image that is generated can be considered to be large in a range 901 in which TI is lower than the predetermined value and variation in the signal intensity of the image that is generated can be considered to be small in a range 902 in which TI is higher than the above-mentioned predetermined value. For the medical application, a range of the possible T1 value of the target issue is experientially known, thereby adjusting the above-mentioned predetermined value using the range of the possible T1 value. For applications other than the medical application, the above-mentioned predetermined value can be adjusted by previously examining the range of the possible T1 value of the target tissue.

In the example of FIG. 8, the sequence control circuitry 110 adjusts R in a region 903 that includes the center in the k space to be "1" and R in each of peripheral regions 904 and 905 in the k space to be higher than "4" in the range 901. The sequence control circuitry 110 adjusts R in the region 903 that includes the center in the k space to be "2" and R in each of the peripheral regions 904 and 905 in the k space to be "4" in the range 902. The sequence control circuitry 110 adjusts R in the above-mentioned manner at any position in the readout 970 direction, for example. That is to say, the sequence control circuitry 110 adjusts R to approximately "3" over the entire k space data illustrated in the example of FIG. 8. Accordingly, R is approximately "3" over the entire k space data illustrated in the example of FIG. 8. The MRI apparatus 100 in the embodiment does not therefore take much time to acquire the MR signals because the R value over the entire k space data is approximately "3" as a relatively large value. That is to say, it does not take much time from the start of the acquisition of the MR signals to the estimation of the parameters such as the T1 value and the T2 value. The MRI apparatus 100 can therefore estimate the parameters efficiently. In addition, the MRI apparatus 100 can generate the parameter mapping images efficiently for the same reason.

As described above, in the range 901, the sequence control circuitry 110 makes adjustment to decrease R in the region 903 and increase R in each of the regions 904 and 905. In the range 902, the sequence control circuitry 110 makes adjustment to increase R in the region 903 to be higher than that in the range 901 and decrease R in each of the regions 904 and 905 to be lower than that in the range 901.

That is to say, the sequence control circuitry 110 executes the pulse sequence to acquire the MR signals arranged in the k space in the region 903 that includes the center in the k space at the sampling density corresponding to R=1 when the TI as the remarkable imaging parameter is included in the range 901. Furthermore, the sequence control circuitry 110 acquires the above-mentioned MR signals in the regions 904 and 905 that differ from the region 903 at the sampling density corresponding to R>4 that differs from the sampling density corresponding to R=1. The range 901 is a range in which the degree of the variation in the corresponding pixel value is equal to or higher than the predetermined value and is an example of a first range. The region 903 is an example of a first region and the regions 904 and 905 are examples of a second region. The sampling density corresponding to R=1 is an example of a first sampling density. The sampling density corresponding to R>4 is an example of a second sampling density.

The sequence control circuitry 110 acquires the above-mentioned MR signals in the region 903 at the sampling density lower than the sampling density corresponding to R=1 when the TI is included in the range 902 that differs from the range 901 and acquires the above-mentioned MR signals in the regions 904 and 905 at the sampling density higher than the sampling density corresponding to R>4. The range 902 is a range in which the degree of the variation in the corresponding pixel value is lower than the predetermined value and is an example of a second range.

In the above-mentioned manner, the sequence control circuitry 110 executes the pulse sequence in a acquisition pattern set such that the sampling densities of a plurality of pieces of k space data are made different in accordance with a predetermined image parameter when the pieces of k space data having different values of the predetermined imaging parameter are acquired while changing the values of the predetermined imaging parameter.

The sequence control circuitry 110 executes the pulse sequence in a acquisition pattern set such that the sampling density over the entire k space data is a predetermined value (for example, R is approximately "3" in the above-mentioned example).

In the range 901, the sequence control circuitry 110 sets the number of phase encodes for which data acquisition is performed in the region 903 to "16" and sets the number of phase encodes in each of the regions 904 and 905 to "7". In the range 902, the sequence control circuitry 110 sets the number of phase encodes in the region 903 to "12" and sets the number of phase encodes in each of the regions 904 and 905 to "9". The number of phase encodes "30" in the range 901 and the number of phase encodes "30" in the range 902 are identical to each other. That is to say, the sequence control circuitry 110 makes the number of phase encodes in the range 901 and the number of phase encodes in the range 902 identical to each other. It should be noted that the number of phase encodes may be different between the different ranges.

Furthermore, phase correction can be performed based on the MR signals (MR data) acquired in the range 902. In this case, the sequence control circuitry 110 is not required to handle the region that includes the null point as the region in which the phase encodes for the acquisition targets are biased to the vicinity of the center in the k space.

Returning back to description of FIG. 7, the arrangement function 123a converts the pieces of MR data based on the MR signals acquired by the receiver coil array 108 to the pieces of k space data and arranges them as the pieces of k space data corresponding to the remarkable imaging parameter in the storage circuitry 122 (step S702).

The image generation function 123b then generates a parameter mapping image by the above-mentioned method based on the pieces of k space data corresponding to the respective values of the remarkable imaging parameter (step S703). As the parameter mapping image, any one of the T1 mapping image, the T2 mapping image, the T2* mapping image, the T1ρ mapping image, and the ADC image or a combination thereof is employed as an example.

Image Generation Method

In the embodiment, the image generation method by the image generation function 123b is not particularly limited. Hereinafter, as an example of the image generation method, two types of methods including a view sharing method in the p axis direction and a k-p method will be described.

View Sharing Method in p Axis Direction

The view sharing method is a method of estimating a sample value at a non-sampled point at the certain time using a sample value at the different time at which the point has been sampled when time-series data is imaged. In the embodiment, the view sharing method is employed while handling the p axis as a temporal axis.

When acquisition density is controlled in accordance with the position on the p axis, for a point in the k space for which the MR signal has been acquired at a certain position on the p axis, no MR signal can be acquired at a different position on the p axis in some cases. For coping with this problem, the image generation function 123b estimates the MR signal at the point at which no MR signal has been acquired using the view sharing method while handling the p axis as the temporal axis in the view sharing method.

Figure 9:
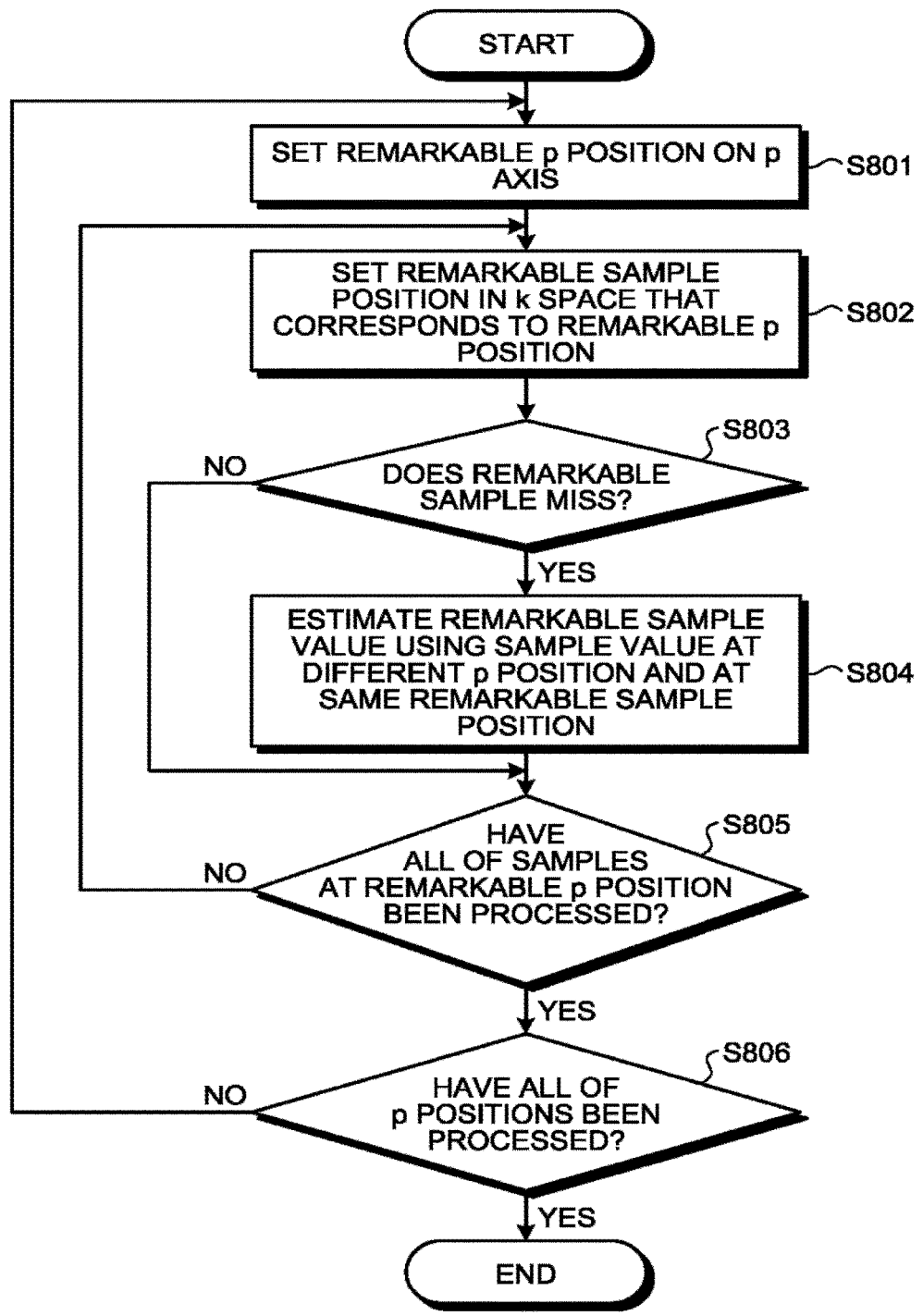
FIG. 9 is a flowchart illustrating an example of flow of processing of estimating an MR signal using a view sharing method in the embodiment.

FIG. 9 is a flowchart illustrating an example of flow of processing of estimating the MR signal using the view sharing method in the embodiment. Before execution of the processing illustrated in FIG. 9, the image generation function 123b ensures a memory enough to hold the pieces of k space data corresponding to all p positions on the p axis and copies sample values provided by sampling in the memory.

As illustrated in the example of FIG. 9, the image generation function 123b sets a remarkable p position on the p axis (step S801).

The image generation function 123b then sets a remarkable sample position in the k space that corresponds to the remarkable p position (step S802). At step S802, the image generation function 123b may not set the remarkable sample position in a region having the above-mentioned R of equal to or lower than the predetermined value, for example, equal to or lower than "3" for which an image can be generated by parallel imaging, compressed sensing, or a combination of the parallel imaging and the compressed sensing. In this case, the image generation function 123b sets the remarkable sample position in a region having the above-mentioned R of higher than the predetermined value, for example, higher than "3" for which it is difficult to generate an image by the parallel imaging, the compressed sensing, or the combination of the parallel imaging and the compressed sensing.

Subsequently, the image generation function 123b determines whether a remarkable sample misses (step S803). When the remarkable sample does not miss (No at step S803), the image generation function 123b advances to step S805. On the other hand, when the remarkable sample misses (Yes at step S803), the image generation function 123b estimates a sample value of the missing remarkable sample using a sample value at a sample position that corresponds to the remarkable sample position at the remarkable p position and the p position of which is different from the remarkable p position (step S804). For example, the image generation function 123b copies a sample value of a sample the p position of which is the closest to that of the missing remarkable sample. The image generation function 123b may set, to the sample value of the remarkable sample, a weighted average of a plurality of sample values that is calculated using the positional difference on the p axis as a weight.

Figure 10:
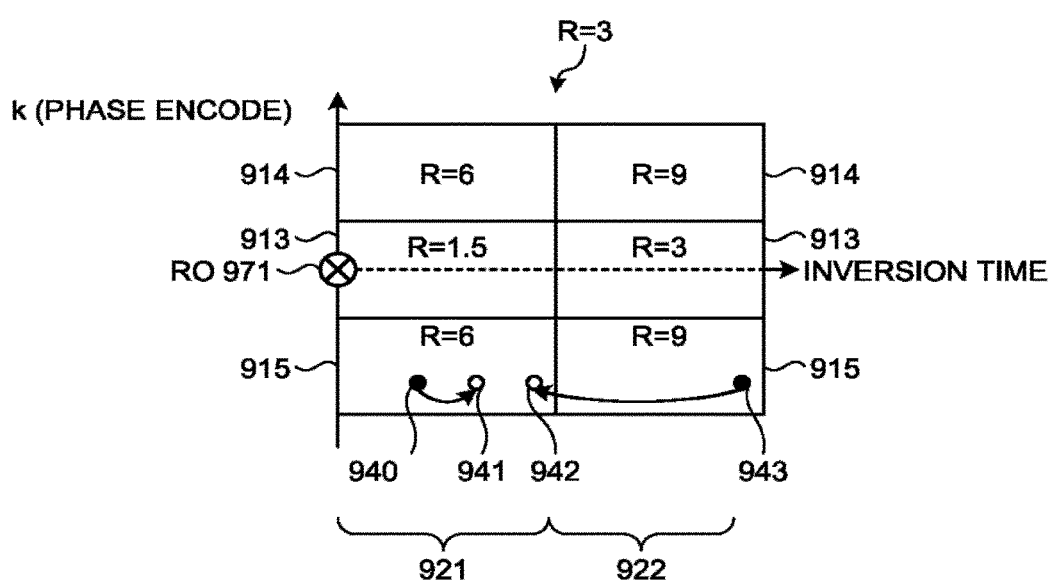
FIG. 10 is a diagram for explaining an example of a method of estimating a sample value in the embodiment.

FIG. 10 is a diagram for explaining an example of a method of estimating the sample value in the embodiment. In the example of FIG. 10, an axis of readout 971 is indicated in addition to an axis of the phase encode. The axis of the readout 971 is orthogonal to the axis of the phase encode. In the example of FIG. 10, the sequence control circuitry 110 adjusts R in a region 913 that includes the center in the k space to be "1.5" and R in each of peripheral regions 914 and 915 in the k space to be "6" in a range 921 in which the TI is lower than the predetermined value. The sequence control circuitry 110 adjusts R in the region 913 to be "3" and R in each of the peripheral regions 914 and 915 to be "9" in a range 922 in which the TI is higher than the above-mentioned predetermined value. The sequence control circuitry 110 adjusts R in the above-mentioned manner at any position in the readout 971 direction, for example.

In the example of FIG. 10, for example, the image generation function 123b copies, as a sample value at a remarkable sample position 942, a sample value at a sample position 943 that corresponds to the remarkable sample position 942 at the remarkable p position and the p position of which is different from the remarkable p position because the remarkable sample at the remarkable sample position 942 misses.

At step S804, the image generation function 123b may copy, as a sample value at a remarkable sample position 941, a sample value at a sample position 940 that is the closest to the remarkable sample position 941 at the remarkable p position and the p position of which is the same as the remarkable p position as illustrated in the example of FIG. 10.

Returning back to description of FIG. 9, the image generation function 123b determines whether all of the sample positions at the remarkable p position have been processed (step S805). When all of the sample positions have been processed (Yes at step S805), the image generation function 123b advances to step S806. On the other hand, when all of the sample positions have not been processed (No at step S805), the image generation function 123b returns to S802 and sets a subsequent remarkable sample position.

Thereafter, the image generation function 123b determines whether all of the p positions have been processed (step S806). When all of the p positions have been processed (Yes at step S806), the processing is finished. On the other hand, when all of the p positions have not been processed (No at step S806), the image generation function 123b returns to S801 and sets a subsequent remarkable p position.

The remarkable sample position that is set at S802 is not necessarily required to be a sample position (corresponding to full-sampling) that is equal to resolution of a reconstructed image. In this case, the pieces of k space data provided after the application of the view sharing method are pieces of data in an under-sampled state. The image generation function 123b can generate the reconstructed image by reconstruction with Fourier transformation when the pieces of k space data corresponding to the full sampling are generated by the view sharing method.

On the other hand, when the pieces of k space data provided after the application of the view sharing method are in the under-sampled state, the image generation function 123b can generate the reconstructed image by reconstruction using the parallel imaging, the compressed sensing, or the combination of the parallel imaging and the compressed sensing. That is to say, the image generation function 123b applies the view sharing method to the pieces of k space data such that R over the entire k space data provided after the application of the view sharing method is equal to or lower than the value (for example, "3") enabling the reconstructed image to be generated using the parallel imaging, the compressed sensing, or the combination of the parallel imaging and the compressed sensing. For example, in the above-mentioned example of FIG. 10, the image generation function 123b applies the view sharing method to the pieces of k space data such that R over the entire k space data provided after the application of the view sharing method is "3". Although the image generation function 123b applies the view sharing method to the pieces of k space data so as to satisfy a condition with which R over the entire k space data is the predetermined value in the above-mentioned example, the image generation function 123b may apply the view sharing to the pieces of k space data without taking this condition into consideration.

It should be noted that the image generation function 123b may compensate missing samples for each other between the k space data corresponding to a certain value on the p axis and the k space data corresponding to another value on the p axis.

k-p Method

Method of reconstructing the time-series data under-sampled both in the time axis direction and the phase encoding direction are generally referred to as k-t methods and various k-t methods are known. The image generation function 123b in the embodiment can generate the reconstructed image using the k-t method while handling the p axis as the temporal axis. This method is called k-p method for the convenience because the p axis is handled as the temporal axis.

The k-t methods that can be applied to the k-p method are roughly divided into two groups. A first group includes methods with which regularity is supposed for the under-sampled state, such as k-t BLAST disclosed in Non-Patent document 1, k-t GRAPPA disclosed in Non-Patent document 2, and k-t PCA disclosed in Non-Patent document 3, and these k-t methods are referred to as regular pattern k-t methods for the convenience. A second group includes methods with which regularity is not supposed for the under-sampled state, such as k-t SLR disclosed in Non-Patent document 4, and the k-t methods are referred to as arbitrary pattern k-t methods for the convenience.

When the image generation function 123b employs the regular pattern k-t method as the k-p method, it is sufficient that the image generation function 123b generates an image by applying the above-mentioned view sharing method in the p axis direction to estimate pieces of sample data necessary for reconstruction so as to cause the pieces of k space data to have regularity, and then applying the regular pattern k-t method. When the image generation function 123b employs the arbitrary pattern k-t method as the k-p method, it is sufficient that the image generation function 123b generates an image by applying the arbitrary pattern k-t method to the pieces of k space data arranged by the arrangement function 123a as it is.

Hereinbefore, the MRI apparatus 100 in the embodiment has been described. As described above, the MRI apparatus 100 can estimate the parameter efficiently.

Modification of Embodiment

In the above-mentioned embodiment, the MRI apparatus 100 performs the sampling density control for respective ranges while dividing values of the remarkable imaging parameter into two ranges. Alternatively, the MRI apparatus 100 may perform the sampling density control for respective ranges while dividing values of the remarkable imaging parameter into equal to or more than three ranges. Here, this modified example will be described as a modification of the embodiment. The following describes an example in which the MRI apparatus 100 performs the sampling density control for respective ranges while dividing values of the remarkable imaging parameter into three ranges with reference to FIG. 11.

Figure 11:
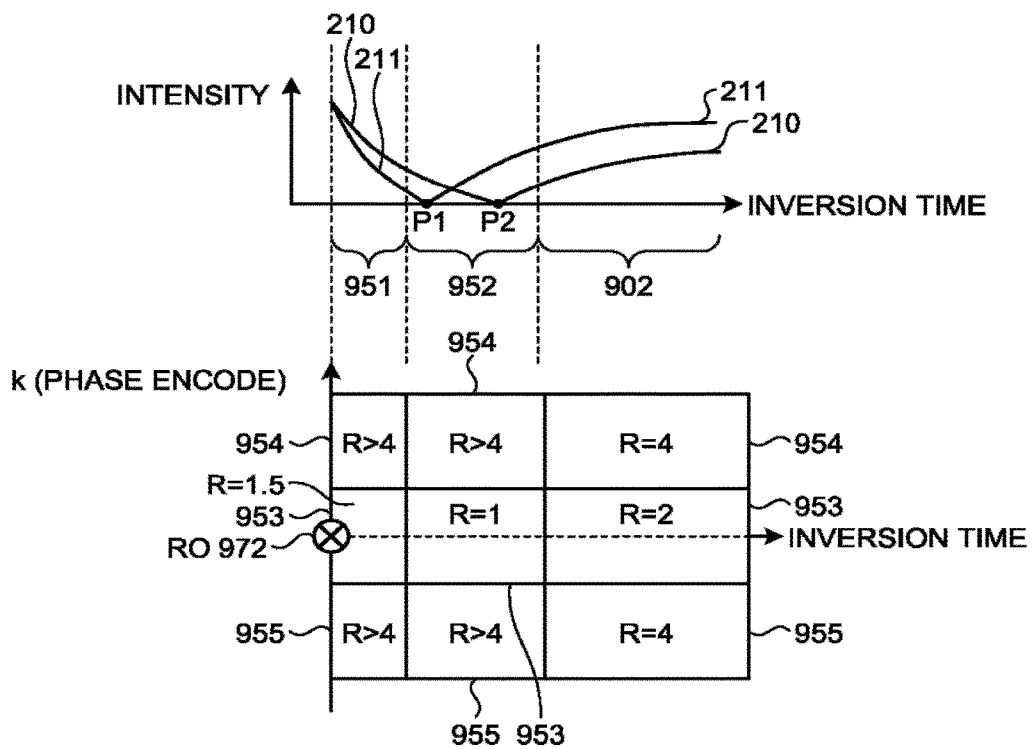
FIG. 11 is a diagram illustrating an example of sampling density control according to a modification.

FIG. 11 is a diagram illustrating an example of the sampling density control according to the modification. FIG. 11 illustrates an example of a method of controlling the sampling density for the TI in the T1 mapping based on the Look-Locker method. In the example of FIG. 11, an axis of readout 972 is indicated in addition to an axis of the phase encode. The axis of the readout 972 is orthogonal to the axis of the phase encode.

In a range 951 illustrated in the example of FIG. 11, variation in the signal intensity of the image is larger than the predetermined value. A range 952 includes null points P1 and P2. Furthermore, the range 902 in the modification is a range that is the same as the range 902 in the above-mentioned embodiment.

In the example of FIG. 11, the sequence control circuitry 110 adjusts R in a region 953 that includes the center in the k space to be "1.5" and R in each of peripheral regions 954 and 955 in the k space to be higher than "4" in the range 951. The sequence control circuitry 110 adjusts R in the region 953 that includes the center in the k space to be "1" and R in each of the peripheral regions 954 and 955 in the k space to be higher than "4" in the range 952. The sequence control circuitry 110 adjusts R in the region 953 that includes the center in the k space to be "2" and R in each of the peripheral regions 954 and 955 in the k space to be "4" in the range 902. The sequence control circuitry 110 adjusts R in the above-mentioned manner at any position in the readout 972 direction, for example. Accordingly, R is approximately "3" over the entire k space data illustrated in the example of FIG. 11. The MRI apparatus 100 in the modification adjusts the R value over the entire k space data to approximately "3" as a relatively large value and it does not therefore take much time to acquire the MR signals. That is to say, it does not take much time from the start of the acquisition of the MR signals to the estimation of the parameters such as the T1 value and the T2 value. The MRI apparatus 100 in the modification can therefore estimate the parameters efficiently. In addition, the MRI apparatus 100 can generate the parameter mapping images efficiently for the same reason.

Although two dimensional acquisition has been described in the embodiment, the invention can also be applied to three-dimensional acquisition. Examples of the arbitrary pattern that can be used include a stack-of-starts pattern and a Poisson disk pattern when it is used in the three-dimensional k-p method.

Image Generation Program

The instructions indicated in the processing procedure in the above-mentioned embodiment can be executed based on a computer program (also referred to as an image generation program) as software. The same effects as those by the MRI apparatus in the above-mentioned embodiment can also be provided by previously storing the image generation program in a general-purpose calculator system and causing the calculator system to load the image generation program. The instructions described in the above-mentioned embodiment are recorded, as a computer-executable image generation program, in a magnetic disk (a flexible disk, a hard disk, or the like), an optical disc (a compact disc read only memory (CD-ROM), a compact disc-recordable (CD-R), a compact disc-rewritable (CD-RW), a digital versatile disc read only memory (DVD-ROM), a digital versatile disc-recordable (DVD±R), a digital versatile disc-rewritable (DVD±RW), or the like), a semiconductor memory, or an equivalent recording medium. Any storage format of the storage medium may be employed as long as it is a computer-readable or integrated system-readable storage medium. A computer loads the image generation program from the recording medium and causes a central processing unit (CPU) to execute the instructions described in the image generation program based on the image generation program, thereby implementing the same operations as those by the MRI apparatus in the above-mentioned embodiment. It is needless to say that the computer may acquire or load the image generation program through a network when acquiring or loading it.

Furthermore, an operating system (OS), database management software, middleware (MW) such as a network, or the like that operates in a computer based on the instructions of the image generation program installed in the computer or an integrated system from a storage medium may execute some of the pieces of processing for achieving the above-mentioned embodiment.

The storage medium is not limited to a medium independent of the computer or the integrated system and includes storage media that download and store or temporarily store the image generation program transmitted through the local area network (LAN), the Internet, or the like.

Furthermore, the storage medium is not limited to one and the storage medium in the embodiment includes the case in which the pieces of processing in the above-mentioned embodiment are executed from a plurality of media. Any medium structure may be employed.

The computer or the integrated system executes the respective pieces of processing in the above-mentioned embodiment based on the computer programs stored in the storage medium and may be configured by one device such as a personal computer and a microcomputer or a system in which a plurality of devices are connected through a network.

Furthermore, the computer is not limited to a personal computer and includes an operation processing device included in an information processing apparatus and a microcomputer and collectively indicate apparatuses and devices capable of implementing the functions in the embodiment by the computer programs.

The MRI apparatus and the image generation method according to at least one of the embodiment and modification as described above can estimate the parameter efficiently.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
    first processing circuitry configured to execute a pulse sequence in an acquisition pattern set such that reduction factors in a plurality of pieces of k space data are made different in accordance with a predetermined imaging parameter when the pieces of k space data having different values of the imaging parameter are acquired while changing the values of the imaging parameter; and
    second processing circuitry configured to generate an image based on the pieces of k space data, wherein
    when the imaging parameter is included in a first range, the first processing circuitry acquires the pieces of k space data in a first region including a center in a k space with a first reduction factor and acquires the pieces of k space data in a second region that differs from the first region with a second reduction factor that differs from the first reduction factor, and
    when the imaging parameter is included in a second range that differs from the first range, the first processing circuitry acquires the pieces of k space data in the first region with a reduction factor higher than the first reduction factor and acquires the pieces of k space data in the second region with a reduction factor lower than the second reduction factor.

2. The magnetic resonance imaging apparatus according to claim 1, wherein the second processing circuitry generates a mapping image for the imaging parameter.

3. The magnetic resonance imaging apparatus according to claim 1, wherein
    the imaging parameter is inversion time (TI),
    the first processing circuitry acquires the pieces of k space data by controlling execution of the pulse sequence including pulse control for emitting radio frequency (RF) pulses of greater than 90 degrees, and
    the second processing circuitry generates a T1 mapping image based on the pieces of k space data.

4. The magnetic resonance imaging apparatus according to claim 1, wherein
    the imaging parameter is echo time (TE),
    the first processing circuitry acquires the pieces of k space data by controlling execution of the pulse sequence including pulse control for acquiring multi echo, and
    the second processing circuitry generates a T2 mapping image based on the pieces of k space data.

5. The magnetic resonance imaging apparatus according to claim 1, wherein
the imaging parameter is spin lock time (TSL),
the first processing circuitry acquires the pieces of k space data by controlling execution of the pulse sequence including pulse control for emitting spin lock pulses, and
the second processing circuitry generates a T1ρ mapping image based on the pieces of k space data.

6. The magnetic resonance imaging apparatus according to claim 1, wherein the first range is a range in which degree of variation in a corresponding pixel value is equal to or higher than a predetermined value and the second range is a range in which the degree of the variation in the corresponding pixel value is lower than the predetermined value.

7. The magnetic resonance imaging apparatus according to claim 1, wherein the second processing circuitry generates, in at least one region of the first region and the second region, first k space data at a k-space position at which k-space data is not acquired, using second k-space data at the k-space position, the first k-space data and the second k-space data corresponding to a different value of the imaging parameter.

8. The magnetic resonance imaging apparatus according to claim 1, wherein the second processing circuitry generates, in at least one region of the first region and the second region, first k space data at a first k-space position at which k-space data is not acquired, using second k-space data at a second k-space position that is within a predetermined range from the first k-space position, the first k-space data and the second k-space data corresponding to a different value of the imaging parameter.

9. The magnetic resonance imaging apparatus according to claim 1, wherein the first processing circuitry acquires the pieces of k space data in the first region with the first reduction factor and acquires the pieces of k space data in the second region with the second reduction factor, and then acquires the pieces of k space data in the first region with a reduction factor higher than the first reduction factor and acquires the pieces of k space data in the second region with a reduction factor lower than the second reduction factor.

10. The magnetic resonance imaging apparatus according to claim 1, wherein the first processing circuitry executes the pulse sequence in the acquisition pattern set such that a sampling density over the entire k space data is a predetermined value.

11. An image generation method comprising:
executing a pulse sequence in an acquisition pattern set such that reduction factors in a plurality of pieces of k space data are made different in accordance with a predetermined imaging parameter when the pieces of k space data having different values of the imaging parameter are acquired while changing the values of the imaging parameter; and
generating an image based on the pieces of k space data, wherein
when the imaging parameter is included in a first range, the method comprises:
acquiring the pieces of k space data in a first region including a center in a k space with a first reduction factor, and
acquiring the pieces of k space data in a second region that differs from the first region with a second reduction factor that differs from the first reduction factor; and
when the imaging parameter is included in a second range that differs from the first range, the method comprises:
acquiring the pieces of k space data in the first region with a reduction factor higher than the first reduction factor, and
acquiring the pieces of k space data in the second region with a reduction factor lower than the second reduction factor.

* * * * *